United States Patent
Jeong

(10) Patent No.: US 7,936,616 B2
(45) Date of Patent: May 3, 2011

(54) DIE THERMAL SENSOR SUITABLE FOR AUTO SELF REFRESH, INTEGRATED CIRCUIT WITH THE SAME AND METHOD FOR ON DIE THERMAL SENSOR SUITABLE FOR AUTO SELF REFRESH

(75) Inventor: Chun-Seok Jeong, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 125 days.

(21) Appl. No.: 12/336,202

(22) Filed: Dec. 16, 2008

(65) Prior Publication Data

US 2010/0061160 A1    Mar. 11, 2010

(30) Foreign Application Priority Data

Sep. 5, 2008    (KR) .................. 10-2008-0087519

(51) Int. Cl.
*G11C 5/14*    (2006.01)
(52) U.S. Cl. .............. 365/189.09; 365/189.07; 365/222; 365/225.7
(58) Field of Classification Search ............. 365/189.09, 365/189.07, 222, 225.7, 211; 374/163, E7.001
See application file for complete search history.

(56) References Cited

U.S. PATENT DOCUMENTS

| 2005/0276134 | A1* | 12/2005 | Mori et al. ................. 365/203 |
| 2006/0098509 | A1* | 5/2006 | Kim ........................... 365/212 |
| 2007/0036015 | A1* | 2/2007 | Sako .......................... 365/211 |
| 2007/0126471 | A1* | 6/2007 | Jeong ........................ 326/30 |
| 2008/0056044 | A1* | 3/2008 | Tomita ....................... 365/222 |
| 2008/0144415 | A1* | 6/2008 | Macerola et al. ........... 365/211 |

FOREIGN PATENT DOCUMENTS

| JP | 2005-222574 | | 8/2005 |
| KR | 1020060028094 | A | 3/2006 |
| KR | 1020060118733 | A | 11/2006 |
| KR | 1020070036642 | A | 4/2007 |

OTHER PUBLICATIONS

Intel® DDR3 Specification, Rev. 0.8.7, Apr. 6, 2006.
Proposed (Apr. 24, 2008 JESD79-3 RevC ballot).

* cited by examiner

*Primary Examiner* — Hoai V Ho
*Assistant Examiner* — Fernando N Hidalgo
(74) *Attorney, Agent, or Firm* — IP & T Group LLP

(57) ABSTRACT

A semiconductor memory device includes a reference voltage generator for generating a plurality of reference voltages each having different voltage levels in response to a self refresh enable control signal, and a voltage comparator for generating a result signal that controls a self refresh operation cycle by comparing each of the plurality of reference voltages with a temperature information voltage that represents an internal temperature of an integrated circuit.

14 Claims, 6 Drawing Sheets

DIE THERMAL SENSOR SUITABLE FOR AUTO SELF REFRESH, INTEGRATED CIRCUIT WITH THE SAME AND METHOD FOR ON DIE THERMAL SENSOR SUITABLE FOR AUTO SELF REFRESH

CROSS-REFERENCE TO RELATED APPLICATION

The present invention claims priority of Korean patent application number 10-2008-0087519, filed on Sep. 5, 2008, which is incorporated by reference in its entirety.

BACKGROUND OF THE INVENTION

The present invention relates to an on die thermal sensor (ODTS), an integrated circuit having the same, and an on die thermal sensing method.

An integrated circuit, for example, a unit cell of a dynamic random access memory (DRAM), includes a transistor and a capacitor. It is determined whether data is stored or not according to whether electric charge is stored in the capacitor or not, that is, according to a terminal voltage of the capacitor. Here, data stored in a unit cell is erased by the unintended loss of electric charge in the capacitor. In order to prevent the unintended data loss, data stored in a unit cell is checked before losing the electric charge in the capacitor and the electric charge is re-charged to a normal level. Such a re-charge process is referred as a refresh operation. The refresh operation is classified into an auto refresh operation and a self refresh operation. The auto refresh operation and the self refresh operation are identical in a view that an address is internally generated in the refresh operation. However, the auto refresh operation and the self refresh operation are different in a refresh cycle, an operation time, and whether it is driven by an external command or not.

The auto refresh operation is performed by an auto refresh instruction (AREF) that is applied at a cycle of several tens ns from an external controller. The self refresh operation is performed by a self refresh start instruction SREF and a self refresh end instruction SREX, which are applied at a cycle of several µs. The cycle of the auto refresh operation is shorter than the cycle of the self refresh operation. The refresh operation is controlled by a controller of an integrated circuit. An integrated circuit consumes a refresh current for performing the refresh operation. Such power consumption for the refresh operation is a very important issue for devices that are driven using a battery.

In order to reduce the power consumption for the refresh operation, the refresh cycle is changed according to a temperature. The lower an internal temperature of an integrated circuit is, the longer a retention time of the integrated circuit becomes. The retention time is duration for normally detecting data before the data is erased. If an internal temperature is low, the power consumption for the refresh operation is reduced because the refresh operation is less frequently performed. Therefore, an on die thermal sensor (ODTS) for sensing an internal temperature is required to decrease the power consumption for the refresh operation.

Meanwhile, the integrated circuit generates more heat according to the increment of an integration level or the increment of the operation speed. Such heat may increase the internal temperature of the integrated circuit and cause an operation error. Therefore, it is necessary to have the ODTS in order to prevent the increment of the internal temperature and the operation error.

FIG. 1 is a diagram illustrating an ODTS according to the related art.

As shown in FIG. 1, the ODTS according to the related art includes a temperature information voltage generator 101, an analog-to-digital converter (ADC) 103, a code convertor 105, and a temperature measurement operation controller 107.

The temperature voltage generator 101 senses an internal temperature of an integrated circuit and generates a temperature information voltage VTEMP in inverse proportion to the sensed temperature.

Also, the temperature information voltage generator 101 generates a maximum voltage variation VULIMIT and a minimum voltage variation VLLIMIT for defining a maximum value and a minimum value for allowing a digital code generated by the ADC 103 according to the variation of the internal temperature of the integrated circuit. The maximum voltage variation VULIMIT and the minimum voltage variation VLLIMIT are voltages not influenced by process, voltage, and temperature (PVT). The maximum voltage variation VUMLIT and the minimum voltage variation VLLIMIT can be set to a predetermined level using a virtual fuse code and a trim code inputted from the temperature information voltage generator 101.

The ADC 103 converts a temperature voltage to a digital code and outputs the digital code. In order to control the minimum voltage variation and the maximum voltage variation VLLIMIT and VULIMIT, the digital code is feedback to the temperature information voltage generator 101.

The code convertor 105 converts the digital code from the ADC 103 to a temp code and a plurality of trip point flags.

For example, the trip point flags are a plurality of flag signals each having different logical level according to an internal temperature of an integrated temperature. For example, flag signals TEMP A, TEMP B, and TEMP C are generated. The plurality of generated flag signals TEMP A, TEMP B, and TEMP C are used to control the cycle of the self refresh operation.

The temperature measurement operation controller 107 controls the ODTS operating in a normal mode based on an enable signal ENABLE inputted from the outside. The temperature measurement operation controller 107 also control the ODTS operation in a self refresh mode based on a self refresh signal SREF inputted from the outside. The temperature measurement operation controller 107 controls the operation of the temperature information output device by deciding a control signal BGR_ON for controlling the operation of the temperature information voltage generator 101 and a control signal ADC_ON for controlling the operation of the ADC 103.

A multipurpose register (MPR) 109 is disposed outside the ODTS and stores the latest temp code generated by the code converter 105. The MPR 109 outputs predetermined information instead of cell data. For example, the MPR 109 defines a predefined pattern [01010101] and a temp code that is internal temperature information of an integrated circuit as predetermined information.

A self refresh oscillator 111 perform an auto self refresh (ASR) operation in a self refresh mode of an integrated circuit and controls a cycle of the self refresh operation in response to a plurality of flag signals TRIP POINT FLAG outputted from the code converter 105. The ASR controls a cycle of a self refresh operation according to an internal temperature of an integrated circuit while performing the self refresh operation. That is, the ASR minimizes unnecessary quiescent current. Meanwhile, the higher the internal temperature of the integrated circuit is the greater the leakage current becomes in the unit cell. Therefore, the retention time becomes shorted.

The ASR prevents data from being lost through frequent refresh operations by controlling the cycle of the self refresh operation shorter if the internal temperature of the integrated circuit increases.

FIG. 2 is a diagram illustrating an analog digital converter of FIG. 1.

As shown in FIG. 2, the ADC 103 includes a comparator 201, an up-down counter 203, a decoder 205, and a digital to analog converter (DAC) 207.

The comparator 201 compares a temperature voltage generated by the temperature information voltage generator 101 with a tracking voltage DACOUT. If a potential level of the temperature voltage VTEMP is smaller than that of the tracking voltage DACOUT, an increment signal INC is activated. If a potential level of the temperature voltage VTEMP is larger than that of the tracking voltage DACOUT, a decrement signal DEC is activated.

The up-down counter 203 generates an up counted digital code based on, for example, the increment signal INC activated by the comparator 201. The up down counter 203 also generates a down-counted digital code based on the decrement signal activated by the comparator 201.

The comparator 201 and the up down counter 203 operate at a predetermined time interval DEALY in response to the sample clock SampleCLK.

The decoder 205 converts the digital code up-down counted by the up down counter 203 to the temperature information code THERMOTHER CODE.

The DAC 207 converts the thermometer code generated from the decoder 205 to a tracing voltage DACOUT. Here, the tracking voltage DACOUT variation range is from the minimum voltage variation VLLIMIT to the maximum voltage variation VUMLIMIT.

Related to the MPR, a function of outputting the internal temperature information of the integrated circuit is rarely used. Therefore, if the rarely used internal temperature information outputting function is removed from the integrated circuit, it is not necessary for the ODTS to output TEMP code, which is an internal temperature of the integrated circuit. Therefore, if the internal temperature information output function is removed, it is not necessary to have the temperature information voltage generator 101 and the ADC 103 which occupy a large layout area In this case, it is necessary to reconfigure the ODTS according to the related art to be suitable for ASR instead of the temp code.

SUMMARY OF THE INVENTION

Embodiments of the present invention are directed to providing an on die thermal sensor (ODTS) optimized for an auto-self refresh operation, an integrated circuit having the same, and a method for the same, which are optimized for an auto self refresh operation.

In accordance with an aspect of the present invention, there is provided a semiconductor memory device including a reference voltage generator configured to receive a self refresh enable control signal and to generate a plurality of reference voltages each having different voltage levels, and a voltage comparator configured to compare each of the plurality of reference voltages with a temperature information voltage that represents an internal temperature of an integrated circuit, and to generate a result signal that controls a self refresh operation cycle.

The semiconductor memory device may further include a pulse generator configured to generate an enable control signal that enables operation of the voltage comparator only during a non self refresh operation period.

The semiconductor memory device may further include a transmitter for converting the plurality of result signals generated by the voltage comparator to a plurality of flag signals and transferring the plurality of flag signals to a self refresh oscillator for performing a self refresh operation.

The semiconductor memory device may further include a temperature sensor for sensing an internal temperature of the integrated circuit and generating the temperature information voltage in inverse proportion to the sensed temperature.

In accordance with another aspect of the present invention, there is provided an integrated circuit including a reference voltage generator configured to receive a self refresh enable control signal and to generate a plurality of reference voltages each having different voltage levels, a voltage comparator configured to compare each of the plurality of reference voltages with a temperature information voltage that represents an internal temperature of an integrated circuit, and to generate a plurality of result signals that control a self refresh operation cycle, and a self refresh oscillator configured to control the self refresh operation cycle based on the plurality of result signals.

The integrated circuit may further include a pulse generator for generating an enable control signal that controls the voltage comparator to operate only during a non self refresh operation period.

The integrated circuit may further include a transmitter for converting the plurality of result signals generated by the voltage comparator to a plurality of flag signals and transferring the plurality of flag signals to a self refresh oscillator for performing a self refresh operation.

The integrated circuit may further include a temperature sensor for sensing an internal temperature of the integrated circuit and generating the temperature information voltage in inverse proportion to the sensed temperature.

In accordance with another aspect of the present invention, there is provided an on die thermal sensor including an output unit configured to receive a self refresh enable control signal and to generate a result signal that controls a self refresh operation cycle by comparing a temperature information voltage that represents an internal temperature of an integrated circuit with each of a plurality of reference voltages, each of the reference voltages having different voltage levels, and a pulse generator configured to generate an enable control signal that enables operation of the output unit only during a non self refresh operation period based on an oscillation clock signal generated by a self refresh oscillator.

In accordance with another aspect of the present invention, there is provided an on die thermal sensing method including generating an enable control signal that is enabled only during a non self refresh operation period, the non self refresh operation period based on an oscillation clock signal generated by a self refresh oscillator, comparing a temperature information voltage that represents an internal temperature of an integrated circuit with each of a plurality of reference voltages in response to enabled enable control signal generated by said generating an enable control signal, each of the reference voltages having different voltage levels, generating a plurality of result signals based on the comparing, the result signals controlling a self refresh cycle; and outputting the result signals.

DESCRIPTION OF SPECIFIC EMBODIMENTS

Figure 1:
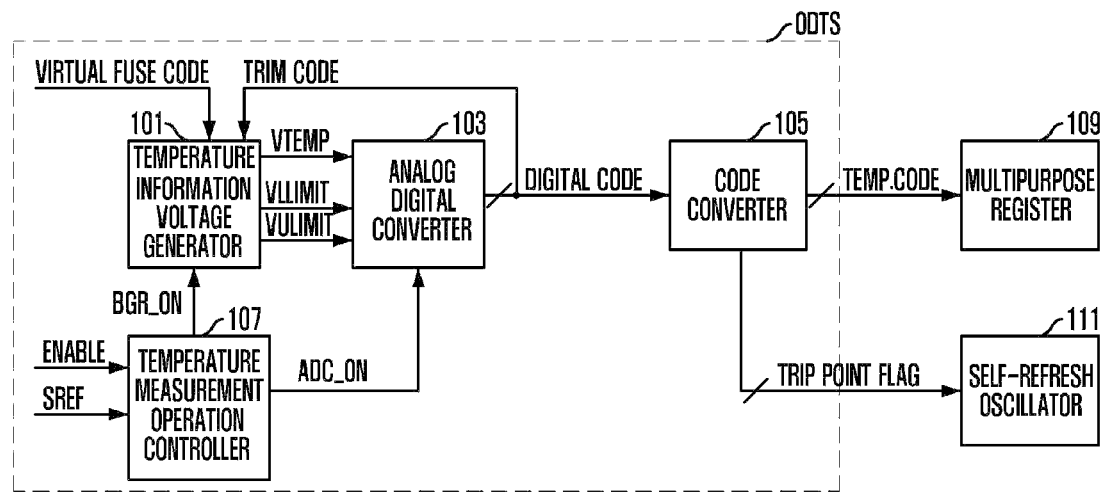
FIG. 1 is a diagram illustrating an ODTS according to the related art.

Following description exemplifies only the principles of the present invention. Even if they are not described or illustrated clearly in the present specification, one of ordinary skill in the art can embody the principles of the present invention and invent various apparatuses within the concept and scope of the present invention. The use of the conditional terms and embodiments presented in the present specification are intended only to make the concept of the present invention understood, and they are not limited to the embodiments and conditions mentioned in the specification. Also, all the detailed description on the principles, viewpoints and embodiments and particular embodiments of the present invention should be understood to include structural and functional equivalents to them. The equivalents include not only currently known equivalents but also those to be developed in future, that is, all devices invented to perform the same function, regardless of their structures.

Although the specification describes an on die thermal sensor (ODTS) and an integrated circuit having the same according to an embodiment of the present invention, an on die thermal sensing method according to an embodiment of the present invention should be understood from the operation of the on die thermal sensor descried in the specification.

Other objects and aspects of the invention will become apparent from the following description of the embodiments with reference to the accompanying drawings, which is set forth hereinafter. The same reference numeral is given to the same element, although the element appears in different drawings. In addition, if further detailed description on the related prior arts is determined to obscure the point of the present invention, the description is omitted. Hereafter, preferred embodiments of the present invention will be described in detail with reference to the drawings.

Figure 3:
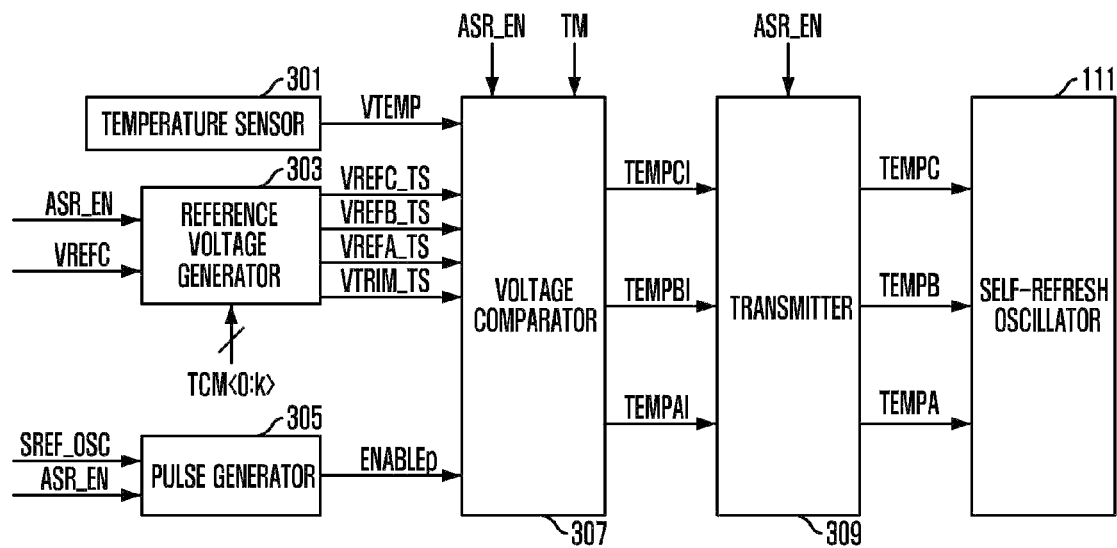
FIG. 3 is a diagram illustrating an on die thermal sensor (ODTS) in accordance with an embodiment of the present invention.

FIG. 3 is a diagram illustrating an on die thermal sensor (ODTS) in accordance with an embodiment of the present invention.

Referring to FIG. 3, the ODTS according to the present embodiment includes a temperature sensor 301, a reference voltage generator 303, a pulse generator 305, a voltage comparator 307, and a transmitter 309.

In the present embodiment, a self refresh enable control signal ASR_EN is a signal for controlling enabling the ODTS according to the present embodiment. Hereinafter, the ODTS enabled by the self refresh enable control signal ASR_EN will be described.

The temperature sensor 301 senses an internal temperature of an integrated circuit using a property that a voltage between a base terminal and an emitter terminal of a bipolar junction transistor (BJT) in a band-gap circuit of the integrated circuit is changed according to the internal temperature of the integrated circuit. The temperature sensor 301 generates a temperature information voltage VTEMP in inverse proportion to the sensed temperature.

The reference voltage generator 303 generates a plurality of reference voltages with different levels, for example, VREFA_TS, VREFB_TS, VREFC_TS, and VTRIM_TS, based on a predetermined reference voltage generated in the integrated circuit. FIG. 3 shows generation of three reference voltages VREFA_TS, VREFB_TS, and VREFC_TS for controlling a self refresh operation cycle and one reference voltage VTRIM_TS for trimming the three reference voltages. The reference voltage VTRIM_TS for trimming is referred to as a trimming voltage, hereinafter. A gap between the three reference voltages VREFA_TS, VREFB_TS, and VREFC_TS, and the trimming voltage VTRIM_TS can be decided in advance. The reference voltages VREFA_TS, VREFB_TS, and VREFC_TS, and the trimming voltage VTRIM_TS will be described in more detail in later with reference to FIGS. 5 and 6.

The pulse generator 305 generates an enable control signal ENABLEp for controlling enabling of the voltage comparator 307. In the present embodiment, it is not necessary to operate the voltage comparator 307 in a self refresh operation period which is regularly performed. It is necessary to operate the voltage comparator 307 in a non self refresh operation period. The enable control signal ENABLEp controls the voltage comparator 307 not to operate in the self refresh operation period. It will be described in detail later with reference to FIGS. 9 and 10.

The voltage comparator 307 compares the temperature voltage VTEMP generated by the temperature sensor 301 with the four reference voltage and the trimming voltage VREFA_TS, VREFB_TS, VREFC_TS, and VTRIM_TS, and outputs a comparison result signal. FIG. 3 shows the voltage comparator 307 generating three comparison result signals TEMPAI, TEMPBI, and TEMPCI.

The transmitter 309 converts the comparison result signals TEMPAI, TEMPBI, and TEMPCI to a plurality of flag signals and transmits the plurality of flag signals to a self refresh oscillator 111, for example. FIG. 3 shows the transmitter 309 generating three flag signals TEMPA, TEMPB, and TEMPC. The plurality of generated flag signals TEMPA, TEMPB, and TEMPC are used to control a self refresh operation period. It will be described in detail later with reference to FIGS. 4 and 7.

Figure 2:
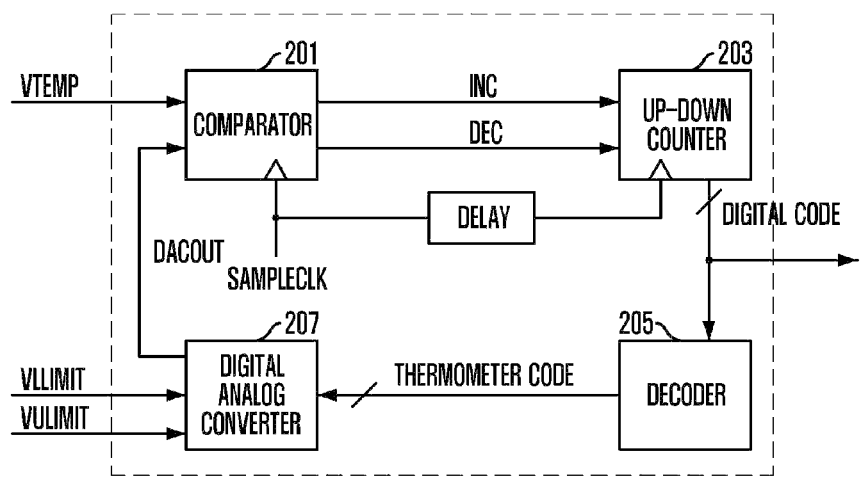
FIG. 2 is a diagram illustrating an analog digital converter of FIG. 1.

Compared with the ODTS according to the related art shown in FIGS. 1 and 2, the ODTS according to the present embodiment shown in FIG. 3 is configured for a temperature information code (TEMP CODE) which is internal temperature information of an integrated circuit and excludes the temperature voltage generator 101 and the ADC 103, which occupy a large layout area. Therefore, the ODTS according to the present embodiment is optimized for the auto self refresh operation.

Figure 4:
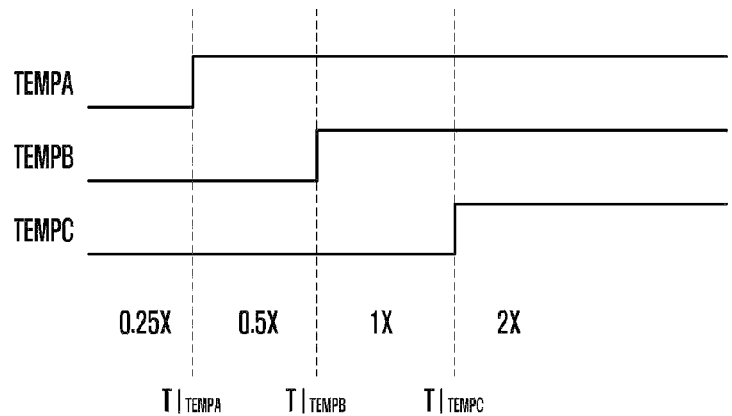
FIG. 4 is a graph for describing the variation of a self refresh operation cycle according to the variation of a temperature information voltage VTEMP.

FIG. 4 is a graph for describing the variation of a self refresh operation cycle according to the variation of a temperature information voltage VTEMP.

For example, the self refresh operation cycle is differently decided according to four temperature regions distinguished by the internal temperatures of the integrated circuit, which are expressed by $TI_{TEMPA}$, $TI_{TEMPB}$, and $TI_{TEMPC}$. For example, the internal temperatures $TI_{TEMPA}$, $TI_{TEMPB}$, and $TI_{TEMPC}$ may be 45° C., 65° C., and 85° C., respectively, and correspond to three flag signals TEMPA, TEMPB, and TEMPC that are transferred from the transmitter 309 to the self refresh oscillator 111.

For example, if the temperature information voltage VTEMP expresses a temperature lower than 45° C. because the internal temperature of the integrated circuit is so low, the three flag signals TEMPA, TEMPB, and TEMPC are low-disabled. Therefore, if the self refresh operation period, which is performed by the self refresh oscillator 111, can be set to four times of a reference cycle, all or some of the flag signals TEMPA, TEMPB, and TEMPC are high-enabled, and the self refresh operation cycle may be set to two times, one times, or 1.5 times of a reference cycle.

Figure 5:
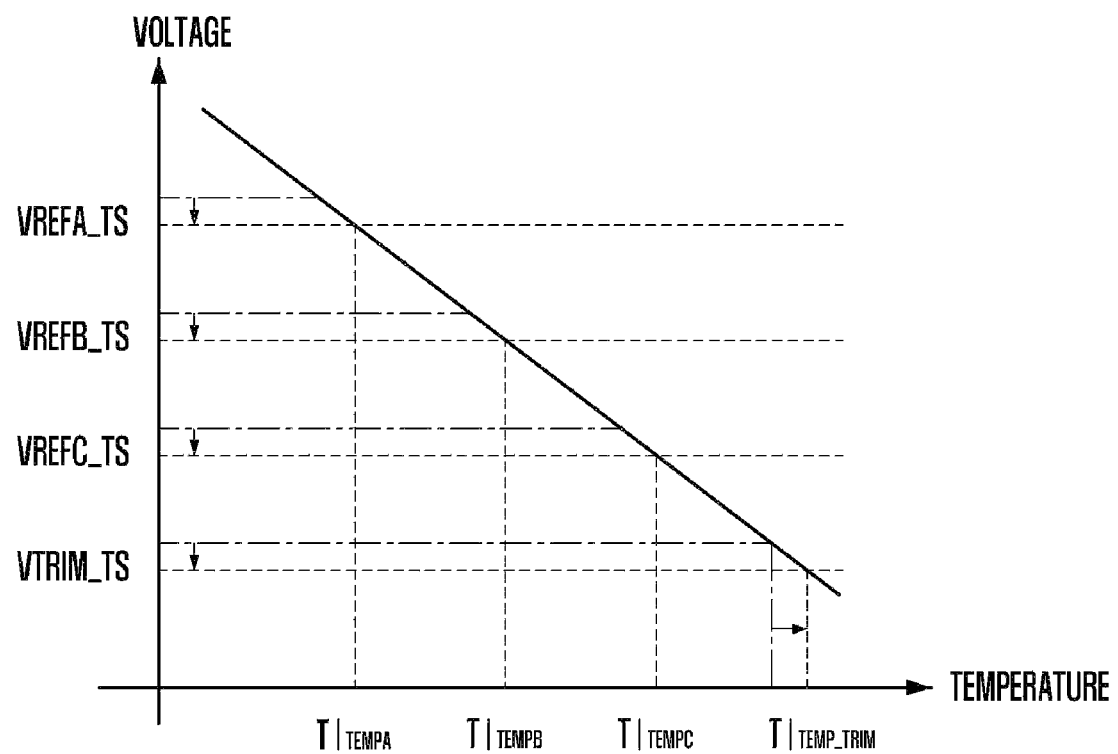
FIG. 5 is a graph showing a relationship among a temperature information voltage VTEMP, reference voltages VREFA_TS, VREFB_TS, and VREFC_TS for controlling a self refresh operation cycle, and a trimming voltage VTRIM_TS for trimming the reference voltages.

FIG. 5 is a graph showing a relationship among a temperature information voltage VTEMP, reference voltages VREFA_TS, VREFB_TS, and VREFC_TS for controlling a self refresh operation cycle and a trimming voltage VTRIM_TS for trimming the reference voltages.

The temperature information voltage is in inverse proportion to the internal temperature of the integrated circuit. The reference voltages VREFA_TS, VREFB_TS, and VREFC_TS, and the trimming voltage VTRIM_TS may be internal temperatures $TI_{TEMPA}$, $TI_{TEMPB}$, $TI_{TEMPC}$, and $TI_{TEMP\_TRIM}$ of the integrated circuit, for example, 45° C., 65° C., 85° C., and 93° C.

As shown in FIG. 5, if the reference voltages VREFA_TS, VREFB_TS, and VREFC_TS accurately correspond to the internal temperatures $TI_{TEMPA}$, $TI_{TEMPB}$, and $TI_{TEMPC}$, the flag signals TEMPA, TEMPB, and TEMPC are accurately low-disabled or high-enabled according to the temperature information voltage VTEMP as described above with FIG. 4. Therefore, it is possible to accurately control the self refresh operation cycle.

If the reference voltages VREFA_TS, VREFB_TS, and VREFC_TS do not accurately correspond to the internal temperatures $TI_{TEMPA}$, $TI_{TEMPB}$, and $TI_{TEMPC}$, the reference voltages VREFA_TS, VREFB_TS, and VREFC_TS must be trimmed for sustaining the high accuracy of the ODTS. The trimming voltage VTRIM_TS is used for trimming the reference voltages VREFA_TS, VREFB_TS, and VREFC_TS. It will be described in more detail with reference to FIGS. 6 to 8.

Figure 6:
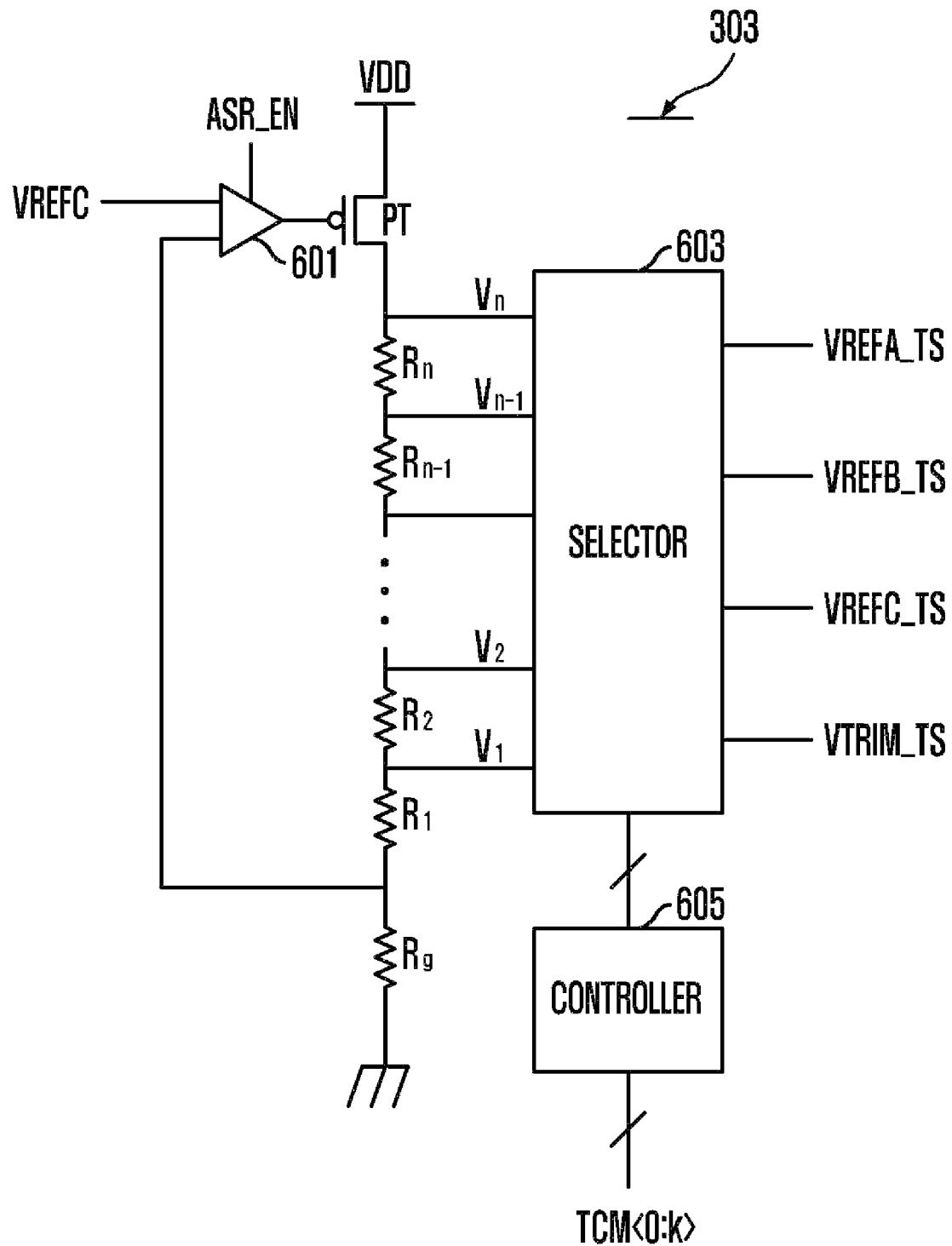
FIG. 6 is a circuit diagram illustrating a reference voltage generator of FIG. 3.

FIG. 6 is a circuit diagram illustrating a reference voltage generator of FIG. 3.

Referring to FIG. 6, the reference voltage generator 303 includes a pull-up transistor PT, a plurality of control resistors R1 to Rn, and a ground resistor Rg, which are connected in serial. The pull-up transistor PT is controlled to be turned on by the output signal of the comparator 601. The comparator 601 compares the temperature information voltage VTEMP generated by the temperature sensor 301 with a voltage between both ends of the ground resistor Rg and outputs the comparison result. Each of the control resistors R1 to Rn is pulled up by the pull-up transistor PT and generates voltages V1 to Vn with different levels, which are expressed by Eq. 1.

$$V_m = \left(1 + \frac{\sum_{t=1}^{m} R_t}{R_g}\right) * VREFC \quad \text{Eq. 1}$$

where, $1 \le m \le n$

In Eq. 1, it is obvious that the number of the control resistors R1 to Rn and the number of voltages V1 to Vn, that is, resolution, can be changed variously according to design necessity.

The comparator 601, the pull up transistor PT, a plurality of control resistors R1 to Rn, and the ground resistor Rg form a down converter.

The selector 603 selects reference voltages with different levels and a trimming voltage VREFA_TS, VREFB_TS, VREFC_TS, and VTRIM_TS from a plurality of voltages V1 to Vn outputted from the control resistors R1 to Rn. For example, a multiplexer is used as the selector 603. FIG. 6 shows the selector 603 generating three reference voltages VREFA_TS, VREFB_TS, and VREFC_TS for controlling a self refresh operation cycle and a trimming voltage VTRIM_TS for trimming the three reference voltages. For example, the three reference voltages VREFA_TS, VREFB_TS, and VREFC_TS for controlling the self refresh operation cycle are the internal temperatures $TI_{TEMPA}$, $TI_{TEMPB}$, and $TI_{TEMPC}$ of the integrated circuit, which are voltages corresponding to 45° C., 65° C., and 85° C. The trimming voltage VTRIM_TS for trimming the three reference voltages is a high test temperature TITEMP_TRIM of the integrated circuit, which is a voltage corresponding to 93° C. However, the present invention is not limited thereto. It is obvious to those skilled in the art that the present invention can be applied to various temperatures.

The controller 605 improves the accuracy of the ODTS according to the present embodiment. The controller 605 performs level shifting, that is, trimming, to select reference voltages and a trimming voltage VREFA_TS, VREFB_TS, VREFC_TS, and VTRIM_TS accurately corresponding to predetermined internal temperatures T|TEMPA, T|TEMPB, T|TEMPC, and T|TEMP_TRIM, for example, 45° C., 65° C., 85° C., and 93° C., from a plurality of voltages V1 to Vn outputted by the control resistors R1 to Rn. For example, controller 605 may be formed of a plurality of [k+1] fuses. The input signal of the controller 605 is [k+1] bits of a fuse cut code TCM<0:K>, which is confirmed through the voltage comparator 307. The controller 605 performing level shifting, that is, trimming, to select reference voltages and a trimming voltage VREFA_TS, VREFB_TS, VREFC_TS, and VTRIM_TS accurately corresponding internal temperatures T|TEMPA, T|TEMPB, T|TEMPC, and T|TEMP_TRIM selected by the selector 603 through fuse-cut based on the fuse cut code TCM<0:K>. For example, reference voltages and a trimming voltage VREFA_TS, VREFB_TS, VREFC_TS, and VTRIM_TS are level-shifted by 2[k+1] level signals generated by [k+1] fuse circuits.

Figure 7:
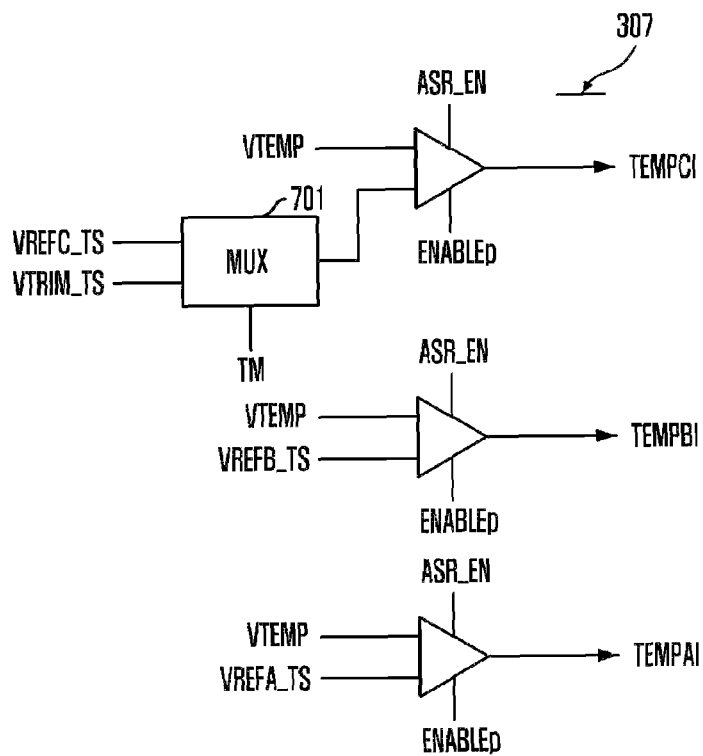
FIG. 7 is a circuit diagram illustrating a voltage comparator shown in FIG. 3.

FIG. 7 is a circuit diagram illustrating a voltage comparator shown in FIG. 3.

As shown in FIG. 7, the voltage comparator 307 includes a plurality of comparators. Each of the comparators is controlled and enabled by an enable control signal ENABLEp generated by the pulse generator 305. Each of the comparators compares the temperature information voltage VTEMP generated from the temperature sensor 301 with a reference voltage for controlling a self refresh operation cycle. FIG. 5 shows a voltage comparator 307 formed of three comparators for comparing three reference voltages VREFA_TS, VREFB_TS, VREFC_TS to control the self refresh operation cycle. The output signals TEMPAI, TEMPBI, and TEMPCI of each comparator are inputted to the transmitter 309.

One of the comparators of the voltage comparator 307 includes a multiplexer 701 at an input terminal receiving the reference voltage. The input signals of the multiplexer 701 are one of the plurality of reference voltages VREFA_TS, VREFB_TS, and VREFC_TS for controlling a self refresh operation cycle and a trimming voltage VTRIM_TS for trimming the plurality of reference voltages. FIG. 7 shows the multiplexer 701 receiving the reference voltage VREFC_TS and the trimming voltage VTRIM_TS for controlling a self refresh operation cycle. The multiplexer 701 selects one of the input signals based on a control signal, for example, a test mode signal (TM), and outputs the selected input signal to the comparator. In a normal mode, the comparator receives the reference voltage VREFC_TS for controlling the self refresh operation cycle. When it is required to trim the plurality of reference voltages, for example, in a test mode, the comparator receives the trimming voltage VTRIM_TS for trimming the plurality of reference voltages.

In the present embodiment, the plurality of comparators compare reference signals VREFA_TS, VREFB_TS, and VREFC_TS with a temperature information voltage VTEMP for controlling a self refresh operation cycle as follows.

Since the reference signals VREFA_TS, VREFB_TS, VREFC_TS denote internal temperatures T|TEMPA, T|TEMPB, T|TEMPC of an integrated circuit corresponding to 45° C., 65° C., and 85° C. as described above, the comparison results TEMPAI, TEMPBI, and TEMPCI of the comparators indicate one of four temperature regions shown in FIG. 4 where the internal temperature expressed by the temperature information voltage VTEMP belongs to.

The transmitter 309 converts the comparison result signals TEMPAI, TEMPBI, and TEMPCI to a plurality of flag signals TEMPA, TEMPB, and TEMPC, and transfers the plurality of flag signals to the self refresh oscillator 111, for example. As described above, the comparison results TEMPAI, TEMPBI, and TEMPCI indicate one of four temperature regions where the internal temperature of the integrated circuit belongs to. Therefore, all or some of the flag signals TEMPA, TEMPB, and TEMPC are high enabled or low disabled according to the internal temperature of the integrated circuit. Therefore, the self refresh oscillator 111 controls the self refresh cycle to four times, two times, one times, or 0.5 times of a refresh cycle based on the flag signals TEMPA, TEMPB, and TEMPC.

Hereinafter, trimming of the reference voltages VREFA_TS, VREFB_TS, and VREFC_TS performed by a plurality of comparators by comparing a trimming voltage VTRIM_TS with a temperature information voltage VTEMP will be described as follows.

Figure 8:
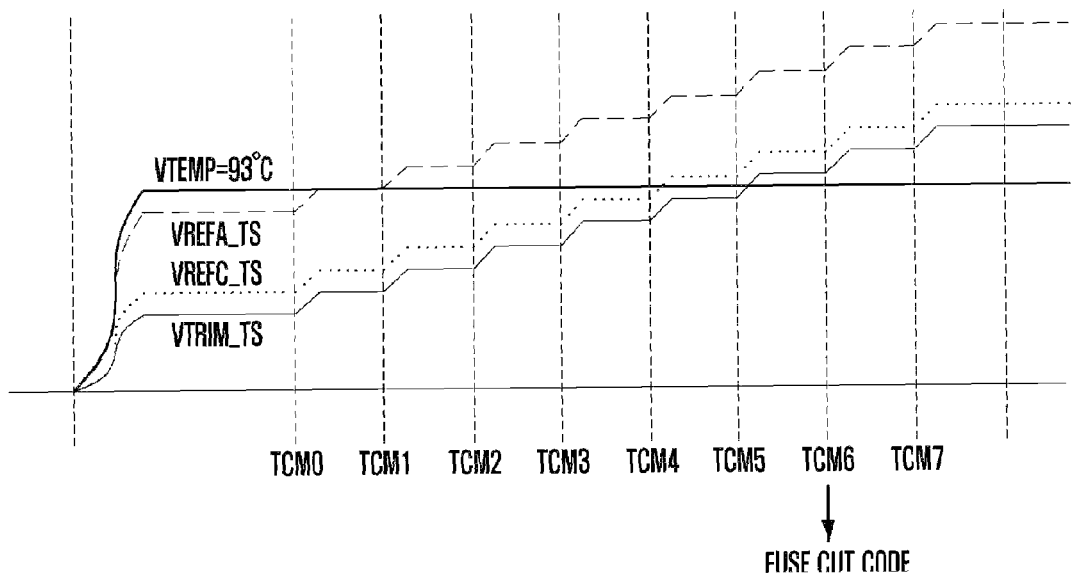
FIG. 8 is a graph for describing a generation of a fuse cut code according to a result of comparing a trimming voltage VTRIM_TS and a temperature information voltage VTEMP in a high temperature test mode of an integrated circuit.

FIG. 8 is a graph for describing generation of a fuse cut code according to a result of comparing a trimming voltage VTRIM_TS and a temperature information voltage VTEMP in a high temperature test mode of an integrated circuit.

As shown in FIG. 8, the temperature information voltage VTEMP is set as a voltage corresponding to high temperature such as 93° C. as an internal temperature T|TEMP_TRIM of the integrated circuit in a high temperature test mode of the integrated circuit. Therefore, it is possible to confirm whether the trimming voltage VTRIM_TS indicates a temperature higher or lower than 93° C. based on the comparison result signal TEMPCI of the comparator that compares the trimming voltage VTRIM_TS with the temperature information voltage VTEMP.

Therefore, the fuse cut code TCM<0:7> for toggling the comparison result signal TEMPCI is confirmed by controlling the trimming voltage VTRIM_TS through controlling the fuse cut code TCM<0:K>described in FIG. 6 and by detecting the comparison result signal TEMPI of the comparator that compares the trimming voltage VTRIM_TS with the temperature information voltage. Level shifting, that is, trimming, is performed to select reference voltages and a trimming voltage VREFA_TS, VREFB_TS, VREFC_TS, and VTRIM_TS accurately corresponding to internal temperatures T|TEMPA, T|TEMPB, T|TEMPC, and T|TEMP_TRIM, which are selected by the selector 603, through fuse-cut of the controller 605 based on the confirmed fuse cut code TCM<0:K>. Therefore, it is possible to improve the accuracy of the ODTS according to the present embodiment through the trimming.

The comparators of the voltage comparator 307 are enabled by the enable control signal ENABLEp generated by the pulse generator 305.

Power noise may flow in the voltage comparator 307 because large power is consumed during performing a self refresh operation. Accordingly, the voltage comparator 307 may generate an incorrect comparison result. Therefore, it is necessary to drive the voltage comparator 307 only during a non self refresh operation period and not to drive the voltage comparator 307 during a self refresh operation period. The pulse generator 305 controls the voltage comparator 307 to operate only during a non self fresh operation period through the enable control signal ENABLEp.

Figure 9:
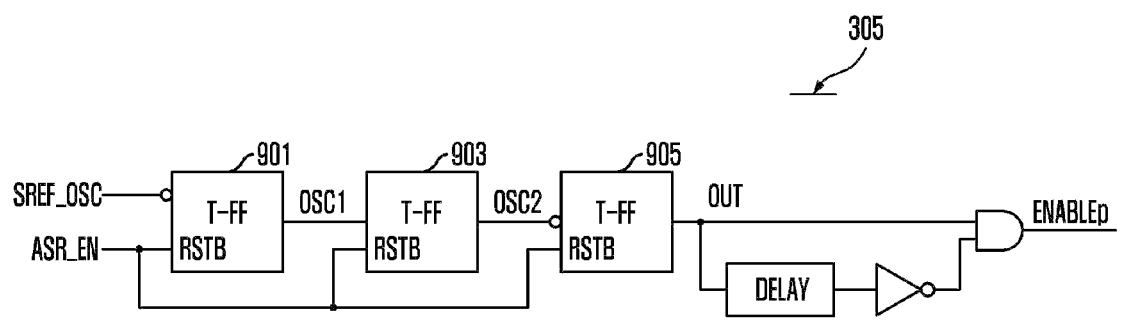
FIG. 9 is a circuit diagram illustrating a pulse generator shown in FIG. 3.
Figure 10:
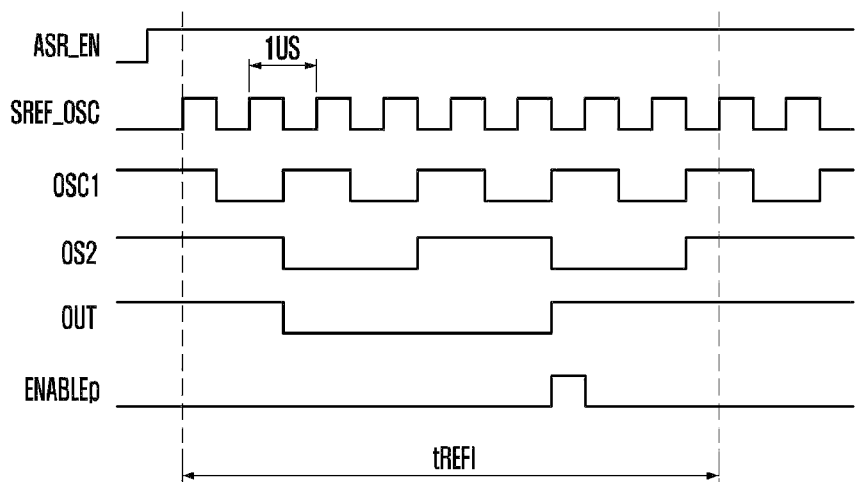
FIG. 10 is a timing diagram for describing an operation of a pulse generator.

FIG. 9 is a circuit diagram illustrating a pulse generator shown in FIG. 3, and FIG. 10 is a timing diagram for describing an operation of a pulse generator.

As shown in FIG. 9, the pulse generator 305 receives an oscillation signal SREF_OSC generated by the self refresh oscillator 111. The cycle of the oscillation clock SREF_OSC, for example, is ⅛ times of a self refresh operation cycle indicated as tREF in FIG. 9, and is interacted to the variation of the self refresh operation cycle. The pulse generator 305 includes three T flip-flops 901 to 905 connected in a cascade structure. Basically, the T flip-flops 901 to 905 invert an output value of a previous stage and outputs the inverted value at a rising edge of a clock. As shown in FIG. 9, the T flip-flops 901 to 905 use an oscillation clock SREF_OSC or an output of the T flip-flop of a previous stage. FIG. 9 is a diagram illustrating first to third flip-flops 901 to 905 using outputs of T flip-flap at a previous stage or an inverted oscillation clock SREF_OSC as a clock signal.

As shown in FIG. 10, an enable control signal ENABLEp is generated by multiplying the output of the third flip-flop 905 with a delayed and inverted output. The enable control signal ENABLEp is a pulse signal enabled during a non self refresh operation period. Therefore, the voltage comparator 307 does not operate during a self refresh operation period, which is performed according to a variable cycle, and operates during a non self refresh operation period because the voltage comparator 307 operates according to the enable control signal ENABLEp generated based on the oscillation clock SREF_OSC that interacts with variation of a self refresh operation cycle by the ODTS.

Although FIG. 9 shows the three T flip-flops 901 to 905 generating the enable control signal ENABLEp during a non self refresh operation period, the number of T flip-flops in the pulse generator 305 may be decided in consideration of the maximum length of the self refresh operation period among self refresh operation cycles tREF. For example, when the cycle of the oscillation clock SREF_OSC become maximum, the self refresh operation cycle tREF becomes maximum too.

Therefore, the self refresh operation period also becomes maximum. The number of the T flip flops may be decided to generate the enable control signal ENABLEp during the non self refresh operation period in consideration of the maximum length of the self refresh operation period.

Embodiments of the present invention relate to an On Die Thermal Sensor ODTS having a minimum area and sustaining high accuracy to be suitable for ASR and an integrated circuit having the same.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   a reference voltage generator configured to receive a self refresh enable control signal and to generate a plurality of reference voltages each having different voltage levels in response to the self refresh enable control signal; and
   a voltage comparator, enabled by an enable signal generated by a pulse generator that receives the self refresh enable control signal, configured to compare each of the plurality of reference voltages with a temperature information voltage that represents an internal temperature of an integrated circuit, and to generate a result signal that controls a self refresh operation cycle in response to the self refresh enable control signal.

2. The semiconductor memory device of claim 1, further comprising a pulse generator configured to generate an enable control signal that enables operation of the voltage comparator only during a non self refresh operation period, the non self refresh operation period based on an oscillation clock signal generated by a self refresh oscillator.

3. The semiconductor memory device of claim 1, wherein the reference voltage generator includes
   a down converter configured to down-convert a first voltage and output a plurality of different voltages; and
   a selector configured to receive the plurality of different voltages and to select the plurality of reference voltages based on the plurality of different voltages.

4. The semiconductor memory device of claim 3, wherein the reference voltage generator further includes,
   a controller configured to control selection of at least one of the plurality of reference voltages by trimming the plurality of reference voltages.

5. The semiconductor memory device of claim 4, wherein the controller trims the plurality of reference voltages based on a fuse cut code corresponding to an amount of voltage to be trimmed.

6. The semiconductor memory device of claim 5, wherein the voltage comparator includes a plurality of comparators, each configured to compare a reference voltage among the plurality of reference voltages with the temperature information voltage.

7. The semiconductor memory device of claim 6, wherein at least one of the plurality of comparators compares the temperature information voltage with a reference voltage in order to determine the fuse cut code to be applied to the plurality of reference voltages.

8. An integrated circuit, comprising:
   a reference voltage generator configured to receive a self refresh enable control signal and to generate a plurality of reference voltages each having different voltage levels in response to the self refresh enable control signal;
   a voltage comparator, enabled by an enable signal generated by a pulse generator that receives the self refresh enable control signal, configured to compare each of the plurality of reference voltages with a temperature information voltage that represents an internal temperature of an integrated circuit, and to generate a plurality of result signals that control a self refresh operation cycle in response to the self refresh enable control signal; and
   a self refresh oscillator configured to control the self refresh operation cycle based on the plurality of result signals.

9. The integrated circuit of claim 8, further comprising a pulse generator configured to generate an enable control signal that enables operation of the voltage comparator only during a non self refresh operation period, the non self refresh operation period based on an oscillation clock signal generated by the self refresh oscillator.

10. The integrated circuit of claim 8, wherein the reference voltage generator includes
    a down converter configured to down-convert a first voltage and output a plurality of different voltages; and
    a selector configured to receive the plurality of different voltages and to select the plurality of reference voltages based on the plurality of different voltages.

11. The integrated circuit of claim 10, wherein the reference voltage generator further includes a controller configured to control selection of at least one of the plurality of reference voltages by trimming the plurality of reference voltages.

12. The integrated circuit of claim 11 wherein the controller trims the plurality of voltages based on a fuse cut code corresponding to an amount of voltage to be trimmed.

13. The integrated circuit of claim 12, wherein the voltage comparator includes a plurality of comparators, each of the comparators configured to compare the temperature information voltage with a reference voltage among the plurality of reference voltages.

14. The integrated circuit of claim 13, wherein at least one of the plurality of comparators compares the temperature information voltage with a reference voltage in order to determine the fuse cut code to be applied to the plurality of reference voltages.

* * * * *

UNITED STATES PATENT AND TRADEMARK OFFICE
CERTIFICATE OF CORRECTION

| | | |
|---|---|---|
| PATENT NO. | : 7,936,616 B2 | Page 1 of 1 |
| APPLICATION NO. | : 12/336202 | |
| DATED | : May 3, 2011 | |
| INVENTOR(S) | : Chun-Seok Jeong | |

It is certified that error appears in the above-identified patent and that said Letters Patent is hereby corrected as shown below:

On the Title page, item (54) and column 1, line 1, Title, should read:

ON DIE THERMAL SENSOR SUITABLE FOR AUTO SELF REFRESH, INTEGRATED CIRCUIT WITH THE SAME AND METHOD FOR ON DIE THERMAL SENSOR SUITABLE FOR AUTO SELF REFRESH

Signed and Sealed this
Tenth Day of July, 2012

David J. Kappos
*Director of the United States Patent and Trademark Office*